United States Patent
Eun et al.

(10) Patent No.: US 7,911,848 B2
(45) Date of Patent: Mar. 22, 2011

(54) MEMORY DEVICE AND MEMORY DATA DETERMINATION METHOD

(75) Inventors: Heeseok Eun, Yongin-si (KR); Jae Hong Kim, Seoul (KR); Kyoung Lae Cho, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 43 days.

(21) Appl. No.: 12/461,060

(22) Filed: Jul. 30, 2009

(65) Prior Publication Data

US 2010/0027342 A1 Feb. 4, 2010

(30) Foreign Application Priority Data

Aug. 1, 2008 (KR) .................. 10-2008-0075555

(51) Int. Cl.
*G11C 16/04* (2006.01)
(52) U.S. Cl. .......... 365/185.18; 365/185.24; 365/185.2; 365/185.03
(58) Field of Classification Search ............. 365/185.18, 365/185.24, 185.2, 185.03
See application file for complete search history.

(56) References Cited

U.S. PATENT DOCUMENTS

| | | | |
|---|---|---|---|
| 6,292,393 B1 | 9/2001 | Tsai et al. | |
| 6,731,542 B1 | 5/2004 | Le et al. | |
| 7,639,539 B2 * | 12/2009 | Cho et al. | 365/185.18 |
| 7,746,691 B2 * | 6/2010 | Roohparvar et al. | 365/185.02 |
| 7,746,702 B2 * | 6/2010 | Cho et al. | 365/185.24 |
| 2005/0047223 A1 | 3/2005 | Chen et al. | |
| 2009/0175076 A1 * | 7/2009 | Cho et al. | 365/185.03 |

FOREIGN PATENT DOCUMENTS

| | | |
|---|---|---|
| JP | 2002-334596 | 11/2002 |
| JP | 2003-249085 | 9/2003 |
| JP | 2006-196114 | 7/2006 |
| KR | 10-2005-0095191 | 9/2005 |

* cited by examiner

*Primary Examiner* — Connie C Yoha
(74) *Attorney, Agent, or Firm* — Harness, Dickey & Pierce, P.L.C.

(57) ABSTRACT

A memory device and a memory data determination method are provided. The memory device may estimate a threshold voltage shift of a first memory cell based on data before the first memory cell is programmed and a target program threshold voltage of the first memory cell. The memory device may generate a metric of a threshold voltage shift of a second memory cell based on the estimated threshold voltage shift of the first memory cell. Also, the memory device may determine data stored in the second memory cell based on the metric.

18 Claims, 6 Drawing Sheets

MEMORY DEVICE AND MEMORY DATA DETERMINATION METHOD

FOREIGN PRIORITY STATEMENT

This application claims the benefit of Korean Patent Application No. 10-2008-0075555, filed on Aug. 1, 2008, in the Korean Intellectual Property Office (KIPO), the entire contents of which are incorporated herein by reference.

BACKGROUND

1. Field

Example embodiments relate to apparatuses and/or methods of determining data stored in a memory device. Also, example embodiments relate to apparatuses and/or methods of determining data stored in a memory device by shifting a threshold voltage of a memory cell.

2. Description of the Related Art

A non-volatile semiconductor memory, one of various storage mediums that can maintain stored data even when power is out, is widely used. One representative non-volatile memory is a flash memory which may have advantages of a smaller size, less power consumption, and higher reading rate compared to a conventional Hard Disk Drive (HDD). Recently, a Solid State Disk (SSD) is suggested to replace the HDD by using flash memory as mass storage.

Representative flash memories may be a NAND flash memory, NOR flash memory, and the like. A method based on NAND and a method based on NOR may be discriminated by a cell array configuration and operation method.

The flash memory may be composed of an arrangement of a plurality of memory cells and a single memory cell may store at least one data bit. The single memory cell may include a control gate and the floating gate. Also, an insulator may provide insulation between the control gate and floating gate, and another insulator may provide insulation between the floating gate and a substrate.

An operation of storing data to the memory cell of the flash memory may be called programming and an operation of erasing a program or data may be performed by a hot carrier effect or a Fowler-Nordheim Tunneling (F-N tunneling) mechanism.

SUMMARY

Example embodiments may provide a memory device and a memory data determination method which may determine data stored in a memory cell based on an effect of coupling among a plurality of adjacent memory cells.

Example embodiments may also provide a memory device and a memory data determination method which may calculate a threshold voltage shift of a memory cell due to coupling.

Example embodiments may also provide a memory device and a memory data determination method which may reduce an error when reading data stored in a memory cell.

According to example embodiments, a memory device may include: a memory cell array including a first memory cell and a second memory cell; and an estimation unit to estimate a threshold voltage shift of the first memory cell based on data before the first memory cell is programmed and a target program threshold voltage of the first memory cell, and generate a metric of a threshold voltage shift of the second memory cell based on the estimated threshold voltage shift of the first memory cell; and a reading unit to determine data stored in the second memory cell based on the metric.

According to example embodiments, a memory data determination method may include: estimating a threshold voltage shift of a first memory cell based on data before the first memory cell is programmed and a target program threshold voltage of the first memory cell; generating a metric of a threshold voltage shift of a second memory cell based on the estimated threshold voltage shift of the first memory cell; and determining data stored in the second memory cell based on the metric.

BRIEF DESCRIPTION OF THE DRAWINGS

The above and other characteristics of example embodiments will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION OF EMBODIMENTS

Detailed example embodiments are disclosed herein. However, any structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, for example "beneath," "below," "lower," "above," "upper," and the like may be used herein for ease of description to describe the relationship of one component and/or characteristic to another component and/or characteristic, or other component(s) and/or characteristic(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated characteristics, integers, steps, operations, elements, and/or components, but do not preclude the presence or addition of one or more other characteristics, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, for example those defined in commonly used dictionaries, should be interpreted as having a meaning that is consistent with their meaning in the context of the relevant art and should not be interpreted in an idealized or overly formal sense unless expressly so defined herein. It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the present disclosure may be applicable to a memory device that stores data by changing a threshold voltage of a memory cell. Examples of the memory device may include a flash memory, Electrically Erasable Programmable Read Only Memory (EEPROM), Phase Shift Random Access Memory (PRAM), Magnetic Random Access Memory (MRAM), and the like.

A memory cell of a non-volatile memory device may be classified into a single level cell and multi-level cell according to a density of data to be stored.

A single-level cell (SLC) may be a type of memory that stores one bit data to a single memory cell. The SLC may also be called a single-bit cell (SBC). A process that stores data to a memory cell of a SLC memory may be called a program process and may change a threshold voltage of the memory cell. For example, when data with a logic value "1" is stored in the SLC, the SLC may have a 1.0 V threshold voltage, and when data with a logic value "0" is stored in the SLC, the SLC may have a 3.0 V threshold voltage.

A threshold voltage of each SLC where the same data is programmed has a certain range of distribution due to a minute electric characteristic difference between the SLCs. For example, when a voltage read from the memory cell is 0.5 to 1.5 V, the data stored in the memory cell may have a logic "1" and when the voltage read from the memory cell is 2.5 V to 3.5 V, the data stored in the memory cell may have a logic "0". The data stored in the memory cell may be discriminated according to an electric current/voltage difference of the memory cell when sensing.

A multi-level cell (MLC) memory may program two or more bits data in a single memory cell. The MLC memory may also be referred to as a multi-bit cell (MBC) memory. Since the MLC may increase a density of data to be stored, it may be relatively more appropriate for embodying a mass memory. However, as the number of bits stored in the single memory cell increases, reliability may deteriorate and a read-failure rate may increase. When m-bit data is programmed to the single memory cell, one of $2^m$ threshold voltages may be required to be formed in the memory cell. Threshold voltages of memory cells in which the same data is programmed may have a distribution of a certain range due to a minute electric characteristic difference between the memory cells. Each of the threshold voltages may respectively correspond to each of $2^m$ data values that may be generated through m bits.

However, since a voltage window of the memory may be limited, as m increases, a distance between $2^m$ distributions of threshold voltages of neighboring bits may decrease, and as the distance decreases, the neighboring distributions may be overlapped. When the neighboring distributions overlap each other, the read-failure rate may increase.

Figure 1:
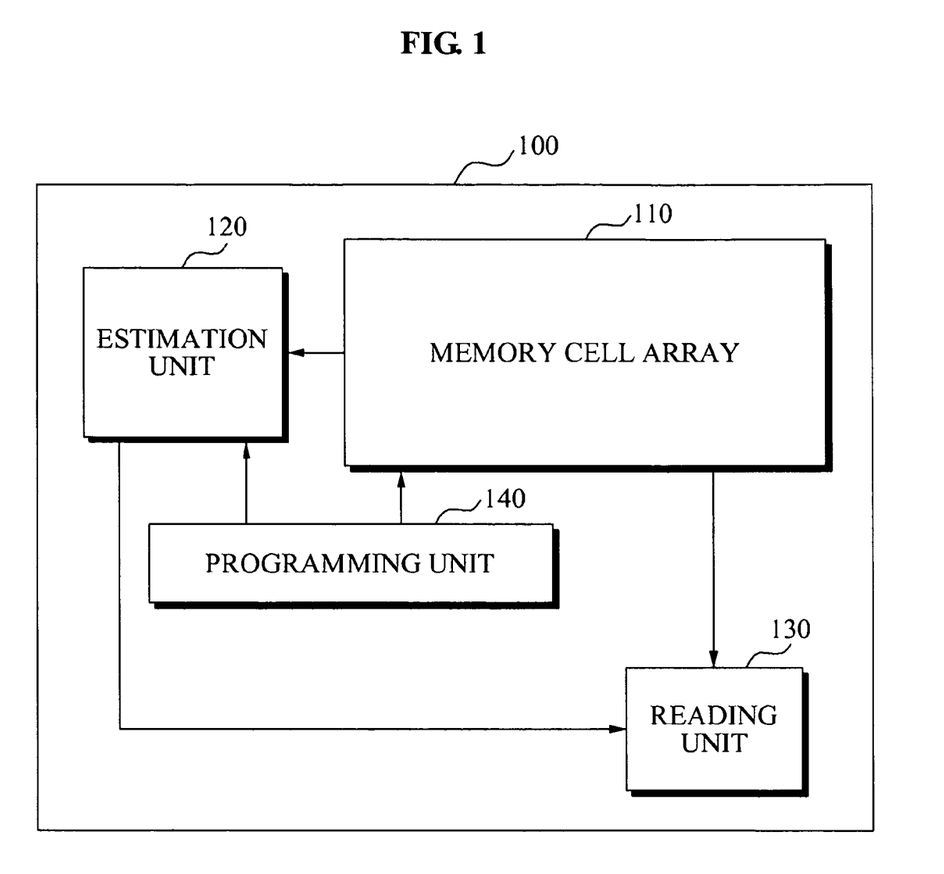
FIG. 1 is a block diagram illustrating a memory device according to example embodiments.

FIG. 1 is a block diagram illustrating a memory device 100 according to example embodiments.

Referring to FIG. 1, the memory device 100 may include a memory cell array 110, an estimation unit 120, a reading unit 130, and a programming unit 140.

The memory cell array 110 may include a plurality of memory cells.

Each of the plurality of memory cells may be identified by a row and column. Memory cells included in a single row may be connected to a single word line. Memory cells included in a single column may be connected to a single bit line.

A memory cell may include a gate terminal composed of metal or poly-silicon and also may include a floating gate (FG) between the gate terminal and channel. The floating gate may be composed of metal or poly-silicon.

The memory device 100 may store a carrier in the FG of the memory cell. When the carrier is stored in the FG, a threshold voltage of the memory cell may change.

A Fowler-Nordheim (F-N) tunneling or Hot Carrier Effect (HCE) may be used to store the carrier in the FG. The carrier may be an electron, hole, and the like.

A change, that is, a shift of a threshold voltage of a single memory cell may affect another threshold voltage due to a parasitic capacitance among FGs of adjacent memory cells. Accordingly, a shift of threshold voltages of a plurality of adjacent memory cells may affect a threshold voltage of a center memory cell. This phenomenon may be referred to as FG coupling.

Another factor of an undesired shift of the threshold voltage of the memory cell may be program disturbance. The program disturbance is a phenomenon where the threshold voltage of the single memory cell may be affected by a program process with respect to another memory cell connected to an identical word line or bit line.

Also, charge loss may cause the undesired shift of the threshold voltage of the memory cell. The threshold voltage of the memory cell may change when the carriers stored in the FG are lost due to a natural diffusion or an insulator around the FG is damaged.

The programming unit 140 may determine a target threshold voltage based on a value of data to be stored in the memory cell. The programming unit 140 may repeat storing the carriers in the FG until a threshold voltage of the memory cell corresponds to the target threshold voltage. The programming unit 140 may remove the carriers stored in the FG of the memory cell to erase the data stored in the memory cell.

A process where the programming unit 140 stores the carriers in the FG of the memory cell in order to store data may be referred to as a program process. A process where the programming unit 140 removes the carriers stored in the FG of the memory cell to erase the data may be referred to as an erase process.

As the memory cell repeats the program process and the erase process, charge retention characteristics of the memory cell may be degraded. Charge loss may occur relatively significantly in a memory cell with degraded charge retention characteristics.

Since the FG coupling, program disturbance, or charge loss may cause the undesired shift of the threshold voltage of the memory cell, a width of a distribution of threshold voltages of the plurality of memory cells may increase. The memory device 100 may estimate a shift of the threshold voltages of the plurality of memory cells and use the estimated shift when reading data stored in the memory cell.

A first memory cell and a second memory cell of the plurality of memory cells included in the memory cell array 110 are described for convenience of description.

The memory device 100 may analyze an effect of a threshold voltage shift of the first memory cell on data stored in the second memory cell in order to read the data stored in the second memory cell.

The estimation unit 120 may estimate the threshold voltage shift of the first memory cell caused by a program process of the first memory cell. The programming unit 140 may determine a target program threshold voltage of the first memory cell based on data which is to be stored in the first memory cell.

The estimation unit 120 may estimate the threshold voltage shift of the first memory cell based on the data stored in the first memory cell before the first memory cell is programmed and the target program threshold voltage of the first memory cell.

The estimation unit 120 may generate a metric of a threshold voltage shift of the second memory cell based on the estimated threshold voltage shift of the first memory cell. The estimation unit 120 may determine a coupling coefficient based on coupling of the first and second memory cells. According to example embodiments, the estimation unit 120 may determine the coupling coefficient based on a geometry of the first and second memory cells.

The estimation unit 120 may determine a coupling coefficient to be greater as a distance between the first and second memory cells decreases.

The estimation unit 120 may determine the data stored in the first memory cell before the first memory cell is programmed based on metadata. The metadata may include information about a current state of a memory cell.

According to another aspect of the present disclosure, the reading unit 130 may read data stored in the first memory cell before the first memory cell is programmed. The estimation unit 120 may obtain the data stored in the first memory cell before the first memory cell is programmed from the reading unit 130. An operation of reading data from a memory cell before programming data into a memory cell is referred to as an internal read.

The estimation unit 120 may generate the metric by multiplying the coupling coefficient with the estimated threshold voltage shift of the first memory cell.

When a program process with respect to a third memory cell is performed before reading the data stored in the second memory cell, the estimation unit 120 may estimate a threshold voltage shift of the third memory cell. The estimation unit 120 may obtain data before the third memory cell is programmed from the reading unit 130 or metadata. The programming unit 140 may determine a target program threshold voltage of the third memory cell based on data which is to be stored in the third memory cell. The estimation unit 120 may estimate the threshold voltage shift of the third memory cell based on the data stored in the third memory cell before the third memory cell is programmed and the target program threshold voltage of the third memory cell.

The estimation unit 120 may determine a coupling coefficient based on coupling of the second and third memory cells. The estimation unit 120 may generate a metric of the threshold voltage shift of the second memory cell based on the estimated threshold voltage shift of the third memory cell and the coupling coefficient.

The metric generated based on the threshold voltage shift of the first memory cell may be a first metric, and the metric generated based on the threshold voltage shift of the third memory cell may be a second metric. The estimation unit 120 may generate a third metric by summing the first and second metrics. The estimation unit 120 may generate the third metric as a metric associated with the threshold voltage shift of the second memory cell.

The reading unit 130 may determine the data stored in the second memory cell based on the third metric.

The reading unit 130 may determine a threshold voltage range of the second memory cell. The reading unit 130 may determine the data stored in the second memory cell based on the determined threshold voltage range and the third metric.

The programming unit 140 may determine a target program threshold voltage based on data to be stored in a memory cell. The programming unit 140 may set a plurality of target program threshold voltage candidates. The programming unit 140 may select any one of the plurality of target program threshold voltage candidates based on the data stored in the memory cell.

The reading unit 130 may set a plurality of reference threshold voltage intervals based on the plurality of target program threshold voltage candidates. The reading unit 130 may determine a first reference threshold voltage interval including a threshold voltage of the second memory cell from among the plurality of reference threshold voltage intervals.

The reading unit 130 may perform a hard decision or soft decision with respect to the data stored in the second memory cell.

When performing the hard decision, the reading unit 130 may assign decision data to each of the plurality of reference threshold voltage intervals. The reading unit 130 may select any one piece of data from data assigned to the first reference threshold voltage interval or other reference threshold voltage intervals based on the third metric.

A threshold voltage interval, which includes threshold voltages that are less than threshold voltages included in the first reference threshold voltage interval and is the closest to the first reference threshold voltage interval, may be referred to as a second reference threshold voltage interval for convenience of description. Also, a threshold voltage interval, which includes threshold voltages that are greater than threshold voltages included in the first reference threshold voltage interval and is the closest to the first reference threshold voltage interval, may be referred to as a third reference threshold voltage interval for convenience of description.

When the third metric is equal to or greater than a first threshold value, the reading unit 130 may determine decision data corresponding to the second reference threshold voltage interval as data of the second memory cell.

When the third metric is equal to or less than a second threshold value, the reading unit 130 may determine decision data corresponding to the third reference threshold voltage interval as data of the second memory cell.

When the third metric is less than the first threshold value and greater than the second threshold value, the reading unit 130 may determine the data stored in the second memory cell based on a decision value assigned to the first reference threshold voltage interval.

When performing the soft decision, the reading unit 130 may assign a decision value to each of the plurality of reference threshold voltage intervals. The decision value may be associated with a probability that each of the plurality of reference threshold voltage intervals is mapped to data. The probability may be represented as a variety of types, for example a log likelihood ratio (LLR) or likelihood ratio (LR).

The reading unit 130 may adjust a decision value assigned to the first reference threshold voltage interval based on the third metric. When the third metric is equal to or greater than the first threshold value, the reading unit 130 may upwardly adjust a probability that the threshold voltage of the second memory cell increases.

The memory device 100 may estimate an effect of coupling, and may thereby reduce an error when reading data. The memory device 100 may represent the effect of coupling as a metric, and may thereby use the metric to perform a decision for each of a plurality of memory cells.

The memory device 100 may Error Control Coding (ECC)-decode the data of the second memory cell. According to example embodiments, the data of the second memory cell may be determined by the reading unit 130. ECC encoding may be defined as a process to generate a codeword by adding redundant information to a message. ECC decoding may be defined as a process to extract the message from the codeword.

The memory device 100 may ECC-encode data, and may thereby generate the codeword, and the programming unit 140 may program the codeword in the plurality of memory cells. The reading unit 130 may determine data stored in the plurality of memory cells based on the third metric, and the memory device 100 may ECC-decode a decision result of the reading unit 130, and may thereby restore the data.

The memory device 100 may reduce a reading error of the data stored in the memory cell through the ECC encoding and/or ECC decoding.

The memory device 100 may store the generated third metric as metadata corresponding to the second memory cell. When the first memory cell or third memory cell is programmed again, the memory device 100 may update the third metric corresponding to the second memory cell.

Figure 2:
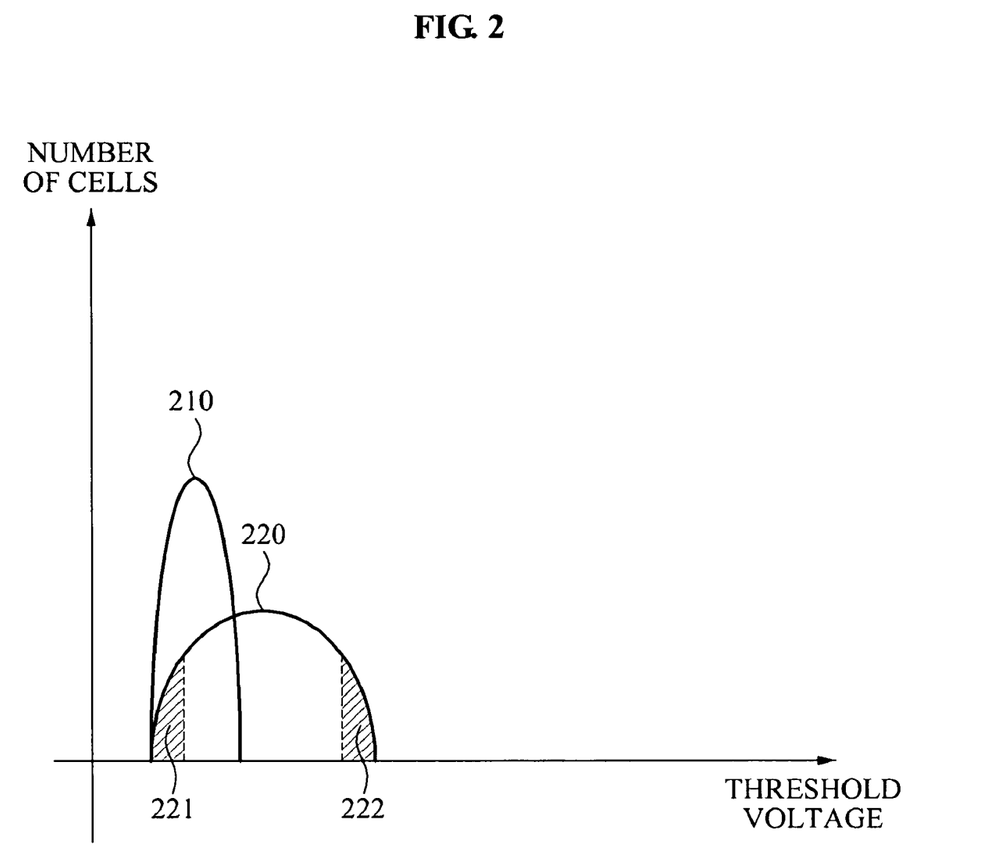
FIG. 2 is a graph illustrating an example of estimation and determination processes of the memory device of FIG. 1.

FIG. 2 is a graph illustrating an example of estimation and determination processes of the memory device 100 of FIG. 1.

Referring to FIG. 2, a distribution 210 may indicate a distribution of threshold voltages of a plurality of memory cells shortly after the plurality of memory cells is programmed. In the example illustrated in FIG. 2, the distribution 210 is not affected by a coupling or program disturbance.

A distribution 220 may indicate a distribution of threshold voltages of a plurality of memory cells affected by the coupling.

A distribution portion 221 may correspond to memory cells that are relatively moderately affected by the coupling. A distribution portion 222 may correspond to memory cells that are relatively substantially affected by the coupling.

The memory device 100 may generate a metric of the memory cells corresponding to the distribution portion 221. According to example embodiments, the metric may be equal to or less than a second threshold value. The memory device 100 may generate a metric of the memory cells corresponding to the distribution portion 222. According to example embodiments, the metric may be equal to or greater than a first threshold value.

The memory device 100 may estimate that a memory cell having the metric, equal to or greater than the first threshold value, is included in the distribution portion 222. The memory device 100 may estimate a threshold voltage range of a memory cell based on a metric stored as metadata.

The memory device 100 may determine data stored in the memory cell based on the estimated threshold voltage range.

Figure 3:
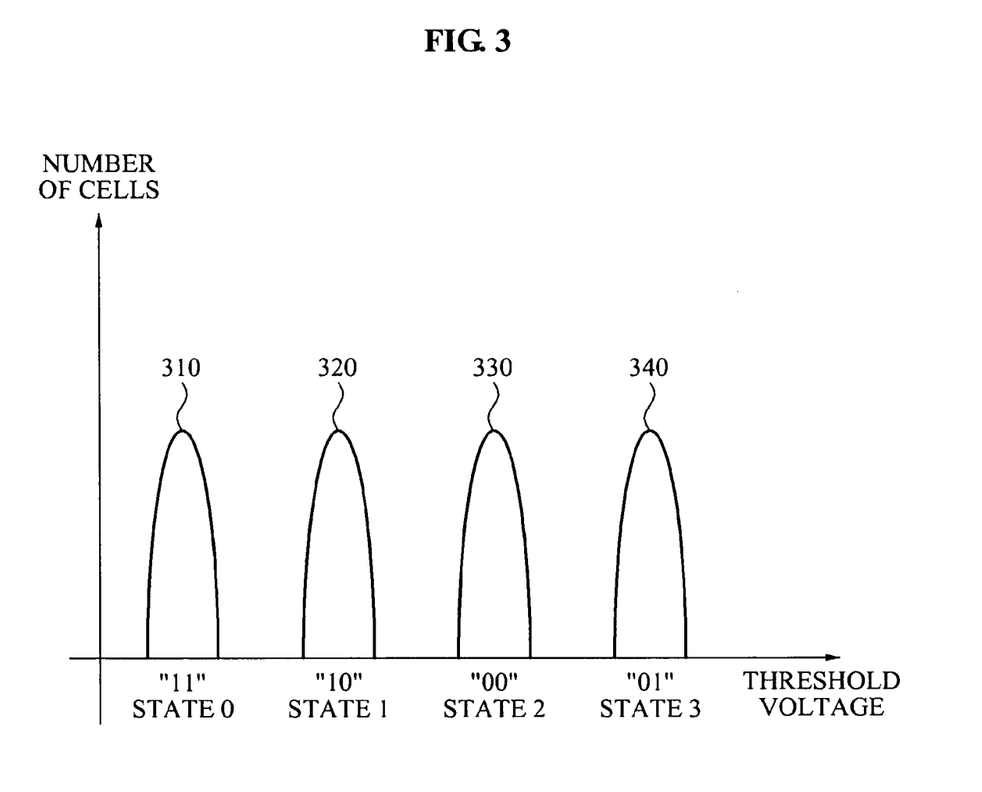
FIG. 3 is a graph illustrating an example of a distribution formed by a program process of the memory device of FIG. 1.

FIG. 3 is a graph illustrating an example of a distribution formed by a program process of the memory device 100 of FIG. 1.

The memory device 100 may determine a target program threshold voltage of a memory cell to store data "11". The memory device 100 may adjust a threshold voltage of the memory cell based on the determined target program threshold voltage.

Since a characteristic of each of a plurality of memory cells is slightly different, threshold voltages of memory cells storing the data "11" may form a distribution 310.

Similarly, threshold voltages of memory cells storing data "10" may form a distribution 320 based on a program process of the memory device 100, and threshold voltages of memory cells storing data "00" may form a distribution 330. Also, threshold voltages of memory cells storing data "01" may form a distribution 340.

The memory device 100 may increase a threshold voltage of each of the memory cells in which data "10" is being stored up to a threshold value greater than the target program threshold voltage. When increasing all the threshold voltages of each of the memory cells in which data "10" is being stored up to the threshold value greater than the target program threshold voltage, all the threshold voltages of each of the memory cells in which data "10" is being stored may form the distribution 320.

The distribution 310 may correspond to a threshold voltage state, state 0. Similarly, the distribution 320, distribution 330, and distribution 340 may correspond to a state 1, a state 2, and a state 3, respectively.

The memory device 100 may predict the distributions 310, 320, 330, and 340, after the program process based on the target program threshold voltage. Accordingly, the memory device 100 may set a plurality of reference threshold voltage intervals, and assign decision data to each of the plurality of reference threshold voltage intervals.

Figure 4:
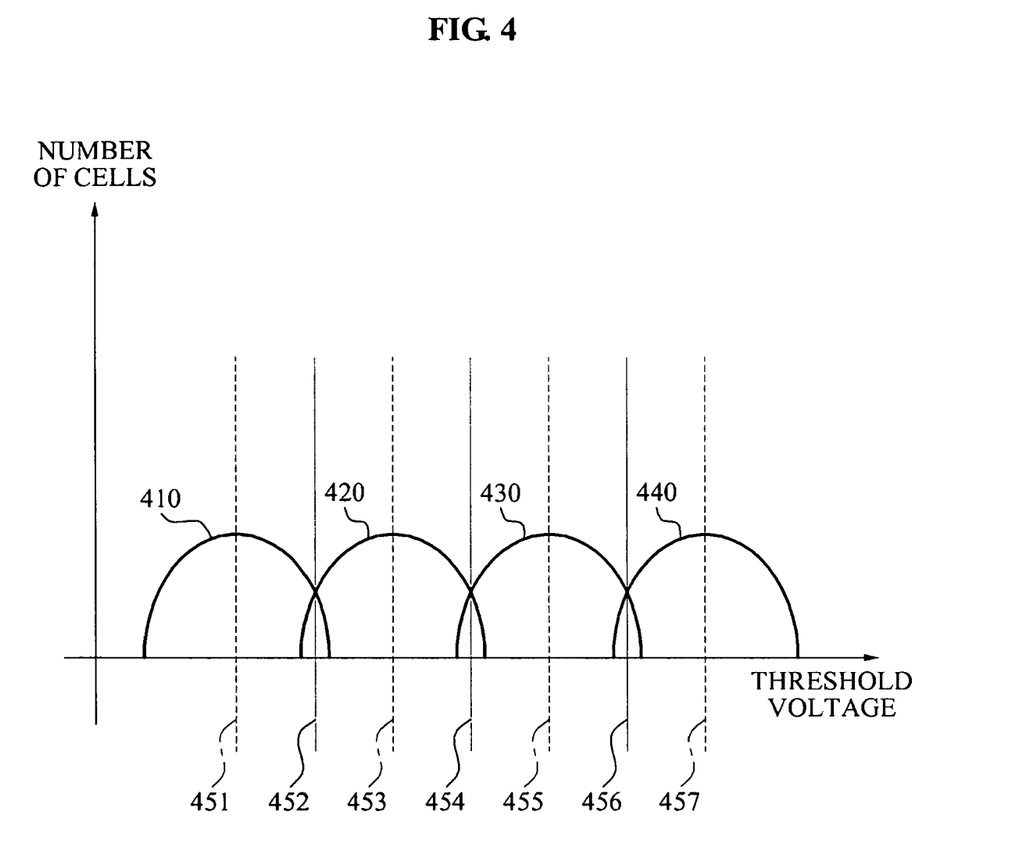
FIG. 4 is a graph illustrating an example of a data determination process of the memory device of FIG. 1.

FIG. 4 is a graph illustrating an example of a data determination process of the memory device 100 of FIG. 1.

A distribution 410 is a distribution of threshold voltages of a plurality of memory cells affected by coupling. In the example illustrated in FIG. 4, distribution, 410, distribution 420, a distribution 430, and a distribution 440 may be distributions of threshold voltages of a plurality of memory cells in which data "11", data "10", data "00", and data "01" is programmed, respectively. Also, the distribution 420, the distribution 430, and the distribution 440 may be the distributions of the threshold voltages of the plurality of memory cells affected by coupling.

The memory device 100 may simultaneously measure a threshold voltage of a plurality of memory cells. For example, the memory device 100 may simultaneously measure whether the threshold voltage of a plurality of memory cells is greater than a read level 454.

The memory device 100 may determine a threshold voltage range of each of the plurality of memory-cells using a-read level 452, the read level 454, or a read level 456. The memory device 100 may assign the data "11" to a threshold voltage interval including a threshold voltage less than the read level 452. The memory device 100 may recognize data stored in the memory cell with a threshold voltage less than the read level 452 as the data "11". Data of a portion of memory cells may be erroneously determined.

The memory device 100 may assign the data "10" to a threshold voltage interval including a threshold voltage less than the read level 454 and greater than the read level 452. The memory device 100 may recognize data stored in a memory cell with the threshold voltage, less than the read level 454 and greater than the read level 452, as the data "10".

The memory device 100 may assign the data "00" to a threshold voltage interval including a threshold voltage less than the read level 456 and greater than the read level 454. The memory device 100 may recognize data stored in a memory cell with the threshold voltage, less than the read level 456 and greater than the read level 454, as the data "00".

The memory device 100 may assign the data "01" to a threshold voltage interval including a threshold voltage greater than the read level 456. The memory device 100 may recognize data stored in a memory cell with the threshold voltage, greater than the read level 456, as the data "01".

The memory device 100 may use the three read levels 452, 454, and 456 to determine two-bit data, which is referred to as an integral read. In the integral read, decision data may be assigned to each of the threshold voltage intervals. According to example embodiments, a hard decision may be used.

Referring again to FIG. 1, the reading unit 130 may set four reference threshold voltage intervals divided by the three read levels 452, 454, and 456. When a threshold voltage of a second memory cell is greater than the read level 452 and less than the read level 454, the reading unit 130 may determine a first reference threshold voltage interval of the second memory cell to be greater than the read level 452 and less than the read level 454.

The memory device 100 may determine the threshold voltage range of each of the plurality of memory cells using a greater number of read levels than an integral read, which is referred to as a fractional read. The memory device 100 may represent data, stored in each of the plurality of memory cells, as a probability using four read levels 451, 453, 455, and 457.

For example, when the threshold voltage of the second memory cell is greater than the read level 453 and less than the read level 454, the memory device 100 may represent a probability that the data stored in the second memory cell is "10" as 0.8, a probability that the data stored in the second memory cell is "00" as 0.15, and a probability that the data stored in the second memory cell is "11" as 0.05.

According to example embodiments, when a metric corresponding to the second memory cell is equal to or less than a second threshold value, the memory device 100 may estimate that the second memory cell is relatively moderately affected by the coupling. When the metric corresponding to the second memory cell is equal to or less than the second threshold value, the memory device 100 may adjust a probability corresponding to the data stored in the second memory cell. For example, the memory device 100 may adjust the probability that the data stored in the second memory cell is "10" to 0.5, the probability that the data stored in the second memory cell is "00" to 0.5, and the probability that the data stored in the second memory cell is "11" to 0.

As another example, when the threshold voltage of the second memory cell is greater than the read level 454 and less than the read level 455, the memory device 100 may represent the probability that the data stored in the second memory cell is "00" as 0.8, the probability that the data stored in the second memory cell is "10" as 0.15, and the probability that the data stored in the second memory cell is "01" as 0.05.

According to example embodiments, when the metric corresponding to the second memory cell is equal to or greater than a first threshold value, the memory device 100 may estimate that the second memory cell is relatively substantially affected by the coupling. When the metric corresponding to the second memory cell is equal to or greater than the first threshold value, the memory device 100 may adjust the probability corresponding to the data stored in the second memory cell. For example, the memory device 100 may adjust the probability that the data stored in the second memory cell is "00" to 0.5, the probability that the data stored in the second memory cell is "10" to 0.5, and the probability that the data stored in the second memory cell is "01" to 0.

The memory device 100 may adjust the first threshold value and/or the second threshold value depending on a hard decision or soft decision.

When the memory device 100 performs the hard decision and the threshold voltage of the second memory cell is greater than the read level 452 and less than the read level 454, the memory device 100 may first determine the data stored in the second memory cell as the data "10".

According to example embodiments, when the metric corresponding to the second memory cell is equal to or greater than the first threshold value, the memory device 100 may secondly determine the data "11", assigned to a threshold voltage interval less than the read level 452, as the data stored in the second memory cell instead of the data "10". Referring again to FIG. 2, when the metric corresponding to the second memory cell is equal to or greater than the first threshold value, the memory device 100 may estimate that the second memory cell is relatively substantially affected by the coupling.

The memory device 100 may estimate that the threshold voltage of the second memory cell increases due to the effect of the coupling, although the data "11" is programmed in the second memory cell.

Conversely, when the metric corresponding to the second memory cell is equal to or less than the second threshold value, the memory device 100 may secondly determine the data "00", assigned to a threshold voltage interval greater than the read level 454, as the data stored in the second memory cell instead of the data "10". Referring again to FIG. 2, when the metric corresponding to the second memory cell is equal to or less than the second threshold value, the memory device 100 may estimate that the second memory cell is relatively moderately affected by the coupling.

The memory device 100 may estimate that data of the second memory cell is erroneously first determined as the data "10", although the data "00" is programmed in the second memory cell.

When the metric corresponding to the second memory cell is less than the first threshold value and greater than the second threshold value, the memory device 100 may secondly determine the data stored in the second memory cell as the data "10".

The memory device 100 may estimate the secondly determined data as the data of the second memory cell.

Figure 5:
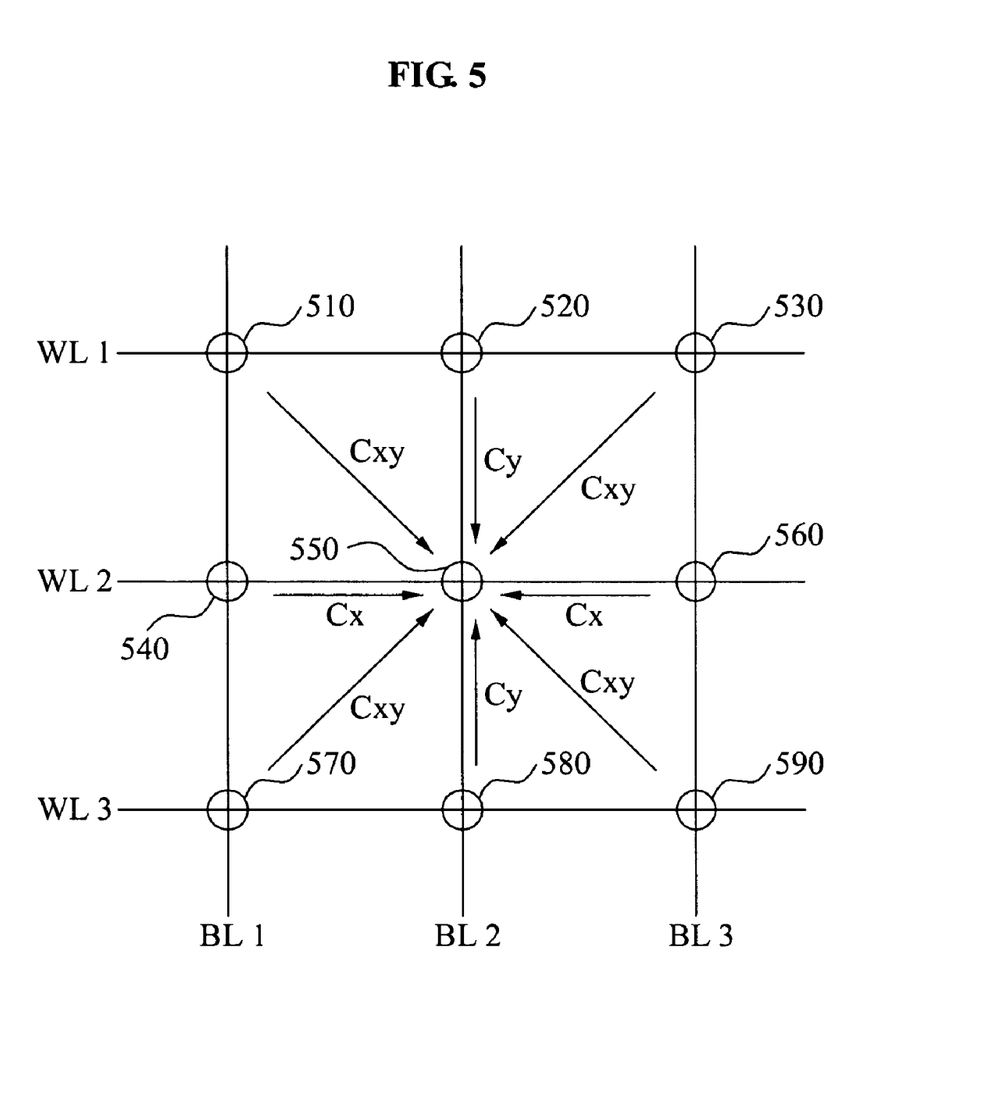
FIG. 5 is a diagram illustrating an example of a metric generation process of the memory device of FIG. 1.

FIG. 5 is a diagram illustrating an example of a metric generation process of the memory device 100 of FIG. 1.

The memory device 100 may generate a metric of a memory cell 550. The memory device 100 may estimate a threshold voltage shift of memory cells 510, 520, 530, 540, 560, 570, 580, and 590 around the memory cell 550, and thereby may generate the metric based on the estimated threshold voltage shift.

Nine memory cells 510, 520, 530, 540, 550, 560, 570, 580, and 590 may be connected to any one of three word lines WL1, WL2, and WL3, and connected to any one of three bit lines BL1, BL2, and BL3.

For example, prior to the memory cell 510 being programmed from a state 0 to a state 3, the memory device 100 may estimate a threshold voltage shift of the memory cell 510 based on a difference between target program threshold voltages of the state 0 and the state 3.

For example, when the memory cell 580 is being programmed to a state 2 from the state 0, before being programmed, the memory device 100 may estimate a threshold voltage shift of the memory cell 580 based on a difference between target program threshold voltages of the state 0 and the state 2.

When an estimated value of the threshold voltage shift of each of the eight surrounding memory cells 510, 520, 530, 540, 560, 570, 580, and 590 is $\Delta V1$, $\Delta V2$, $\Delta V3$, $\Delta V4$, $\Delta V6$, $\Delta V7$, $\Delta V8$, and $\Delta V9$, a metric M of the memory cell 550 may be represented as, $$M = Cxy(\Delta V1 + \Delta V3 + \Delta V7 + \Delta V9) + Cx(\Delta V4 + \Delta V6) + Cy(\Delta V2 + \Delta V8)$$ [Equation 1]

Referring to Equation 1, Cxy may denote a coupling coefficient of a diagonal direction, Cx may denote a coupling coefficient among adjacent memory cells connected to a single word line, and Cy may denote a coupling coefficient among adjacent memory cells connected to a single bit line.

Figure 6:
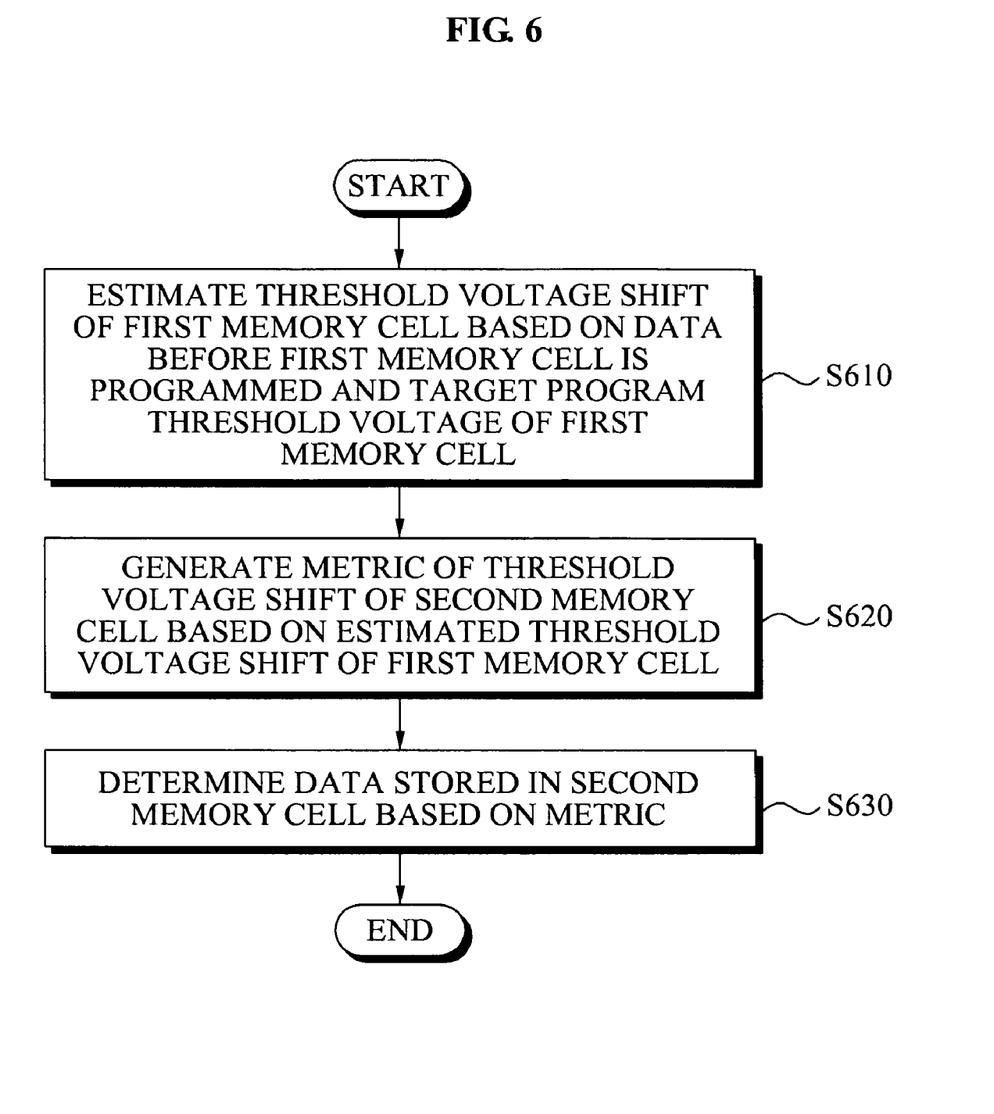
FIG. 6 is a flowchart illustrating a memory data determination method according to example embodiments.

FIG. 6 is a flowchart illustrating a memory data determination method according to example embodiments.

In operation S610, the memory data determination method may estimate a threshold voltage shift of a first memory cell based on data stored in the first memory cell before the first memory cell is programmed and a target program threshold voltage of the first memory cell.

In operation S620, the memory data determination method may generate a metric of a threshold voltage shift of a second memory cell based on the estimated threshold voltage shift of the first memory cell.

In operation S630, the memory data determination method may determine data stored in the second memory cell based on the metric.

In operation S630, the memory data determination method may adjust a decision value of the data stored in the second memory cell-based on the metric.

In operation S630, the memory data determination method may use a hard decision or soft decision.

The memory data determination method according to example embodiments may be recorded in computer-readable media including program instructions to implement various operations embodied by a computer. The media may also include, alone or in combination with the program instructions, data files, data structures, and/or the like. The media and program instructions may be those especially designed and constructed for the purposes of example embodiments, or they may be of the kind well-known and available to those having skill in the computer software arts. Examples of computer-readable media may include magnetic media, for example hard disks, floppy disks, and magnetic tape; optical media, for example CD ROM disks and DVD; magneto-optical media, for example optical disks; and hardware devices that are especially configured to store and perform program instructions, for example read-only memory (ROM), random access memory (RAM), flash memory, and the like. Examples of program instructions may include both machine code, for example, produced by a compiler, and files containing higher level code that may be executed by the computer using an interpreter. The described hardware devices may be configured to act as one or more software modules in order to perform the operations of example embodiments.

Flash memory devices and/or memory controllers according to example embodiments may be embodied using various types of packages. For example, the flash memory devices and/or memory controllers may be embodied using packages, for example Package on Packages (PoPs), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Quad Flatpack (QFP), Small Outline Integrated Circuit (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The flash memory devices and/or the memory controllers may constitute memory cards. In example embodiments, the memory controllers may be constructed to communicate with an external device for example, a host using any one of various types of protocols, for example a Universal Serial Bus (USB), a Multi Media Card (MMC), a Peripheral Component Interconnect-Express (PCI-E), Serial Advanced Technology Attachment (SATA), Parallel ATA (PATA), Small Computer System Interface (SCSI), Enhanced Small Device Interface (ESDI), and Integrated Drive Electronics (IDE).

The flash memory devices may be non-volatile memory devices that may maintain stored data even when power is cut off. According to an increase in the use of mobile devices, for example a cellular phone, a personal digital assistant (PDA), a digital camera, a portable game console, and an MP3 player, the flash memory devices may be more widely used as data storage and code storage. The flash memory devices may be used in home applications, for example a high definition television (HDTV), a digital video disk (DVD), a router, and a Global Positioning System (GPS).

A computing system, according to example embodiments, may include a microprocessor that may be electrically connected with a bus, a user interface, a modem, for example a baseband chipset, a memory controller, and a flash memory device. The flash memory device may store N-bit data via the memory controller. The N-bit data may be processed or will be processed by the microprocessor and N may be 1 or an integer greater than 1. When the computing system is a mobile apparatus, a battery may be additionally provided to supply operation voltage to the computing system.

It will be apparent to those of ordinary skill in the art that the computing system according to example embodiments may further include an application chipset, a camera image processor (CIS), a mobile Dynamic Random Access Memory (DRAM), and the like. The memory controller and the flash memory device may constitute a solid state drive/disk (SSD) that uses a non-volatile memory to store data.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A memory device comprising:
   a memory cell array including at least first and second memory cells; and
   an estimation unit configured to estimate a threshold voltage shift of the first memory cell based on data stored in the first memory cell before the first memory cell is programmed and a target program threshold voltage of the first memory cell, and generate a first metric, the first metric being a metric of a threshold voltage shift of the second memory cell based on the estimated threshold voltage shift of the first memory cell; and
   a reading unit configured to determine data stored in the second memory cell based on the metric.

2. The memory device of claim 1, wherein the reading unit is configured to determine a threshold voltage range of the second memory cell, and determine the data stored in the second memory cell based on the determined threshold voltage range and the first metric.

3. The memory device of claim 2, wherein the reading unit is configured to set a plurality of reference threshold voltage intervals, and determine a first reference threshold voltage interval including the threshold voltage of the second memory cell from among the plurality of reference threshold voltage intervals.

4. The memory-device of claim 3, wherein the reading unit is configured so that if the first metric is equal to or greater than a first threshold value, the reading unit determines data corresponding to a second reference threshold voltage interval as data of the second memory cell, the second reference threshold voltage interval including threshold voltages less than the threshold voltages included in the first reference threshold voltage interval.

5. The memory device of claim 3, wherein the reading unit is configured so that if the first metric is equal to or less than a second threshold value, the reading unit determines data corresponding to a third reference threshold voltage interval as data of the second memory cell, the third reference threshold voltage interval including threshold voltages greater than the threshold voltages included in the first reference threshold voltage interval.

6. The memory device of claim 3, wherein the reading unit is configured so that if the first metric is less than a first threshold value and greater than a second threshold value, the reading unit determines data corresponding to the first reference threshold voltage interval as data of the second memory cell.

7. The memory device of claim 1, wherein the estimation unit is configured to determine a coupling coefficient based on a geometry of the first and second memory cells, and generate the first metric based on the coupling coefficient and the estimated threshold voltage shift of the first memory cell.

8. The memory device of claim 7, wherein the estimation unit is configured to determine the coupling coefficient to be greater as a distance between the first and second memory cells decreases.

9. The memory device of claim 1, wherein the estimation unit is configured to obtain the data before the first memory cell is programmed based on metadata.

10. The memory device of claim 1, wherein the reading unit is configured to read data stored in the first memory cell, before the first memory cell is programmed.

11. A memory data determination method comprising:
    estimating a threshold voltage shift of a first memory cell based on data stored in the first memory cell before the first memory cell is programmed and a target program threshold voltage of the first memory cell;
    generating a metric of a threshold voltage shift of a second memory cell based on the estimated threshold voltage shift of the first memory cell; and
    determining data stored in the second memory cell based on the metric.

12. The memory data determination method of claim 11, wherein the determining includes
    determining a threshold voltage range of the second memory cell, and
    determining the data stored in the second memory cell based on the determined threshold voltage range and the metric.

13. The memory data determination method of claim 12, wherein the determining of the threshold voltage range includes
    setting a plurality of reference threshold voltage intervals and
    determining a first reference threshold voltage interval including the threshold voltage of the second memory cell from among the plurality of reference threshold voltage intervals.

14. The memory data determination method of claim 13, wherein, when the metric is equal to or greater than a first threshold value, the determining of the data determines data corresponding to a second reference threshold voltage interval as data of the second memory cell, the second reference threshold voltage interval including threshold voltages less than threshold voltages included in the first reference threshold voltage interval.

15. The memory data determination method of claim 13, wherein, when the metric is equal to or less than a second threshold value, the determining of the data determines data corresponding to a third reference threshold voltage interval as data of the second memory cell, the third reference threshold voltage interval including threshold voltages greater than threshold voltages included in the first reference threshold voltage interval.

16. The memory data determination method of claim 13, wherein, when the metric is less than a first threshold value and greater than a second threshold value, the determining of the data determines data corresponding to the first reference threshold voltage interval as data of the second memory cell.

17. The memory data determination method of claim 11, wherein the generating of the metric includes
    determining a coupling coefficient based on a geometry of the first and second memory cells, and
    generating the metric of the threshold voltage shift of the second memory cell based on the coupling coefficient and the estimated threshold voltage shift of the first memory cell.

18. A computer-readable recording medium storing a program for implementing a memory data determination method, the method comprising:
    estimating a threshold voltage shift of a first memory cell based on data stored in the first memory cell before the first memory cell is programmed and a target program threshold voltage of the first memory cell;
    generating a metric of a threshold voltage shift of a second memory cell based on the estimated threshold voltage shift of the first memory cell; and
    determining data stored in the second memory cell based on the metric.

* * * * *